(12) United States Patent
Gupta et al.

(10) Patent No.: US 7,804,699 B2
(45) Date of Patent: Sep. 28, 2010

(54) SEGMENTED TERNARY CONTENT ADDRESSABLE MEMORY SEARCH ARCHITECTURE

(75) Inventors: Sharad Kumar Gupta, Kanpur (IN); Morris Dwayne Ward, McKinney, TX (US); Rashmi Sachan, Bangalore (IN); Dharmesh Kumar Sonkar, Bangalore (IN); Sunil Kumar Misra, Bangalore (IN); Yunchen Qiu, Plano, TX (US); Anuroop S. S. R Vuppala, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/344,294

(22) Filed: Dec. 26, 2008

(65) Prior Publication Data

US 2010/0165690 A1    Jul. 1, 2010

(51) Int. Cl.
*G11C 15/00* (2006.01)

(52) U.S. Cl. ............... 365/49.1; 365/49.15; 365/49.16; 365/49.17

(58) Field of Classification Search ............... 365/49.1, 365/49.15–49.17; 711/108
See application file for complete search history.

(56) References Cited

U.S. PATENT DOCUMENTS 7,616,468 B2 *   11/2009   Chai et al. ................. 365/49.1

* cited by examiner

*Primary Examiner*—David Lam
(74) *Attorney, Agent, or Firm*—Dawn V. Stephens; Wade James Brady, III; Frederick J. Telecky, Jr.

(57) ABSTRACT

A segmented ternary content addressable memory (TCAM) search architecture is disclosed. In one embodiment, a TCAM device with a row of TCAM cells includes a first segment of the TCAM cells for determining a match of corresponding search bits of a search string with a first portion of a stored string in the first segment of the TCAM cells, an evaluation module for generating a search enable signal if the match of the corresponding search bits with the first portion of the stored string is determined, and a second segment of the TCAM cells for determining a match of remaining search bits of the search string with a remaining portion of the stored string in response to the search enable signal.

20 Claims, 9 Drawing Sheets

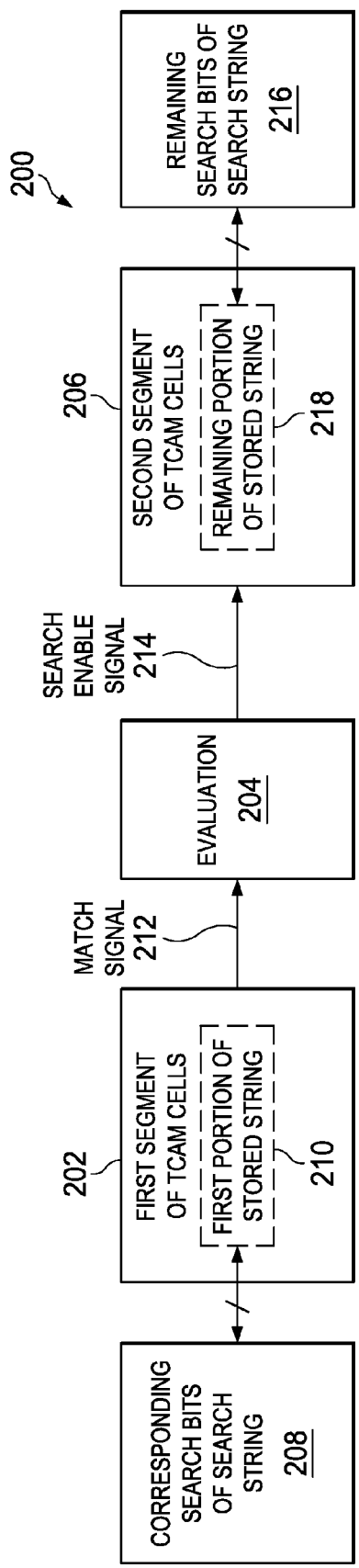
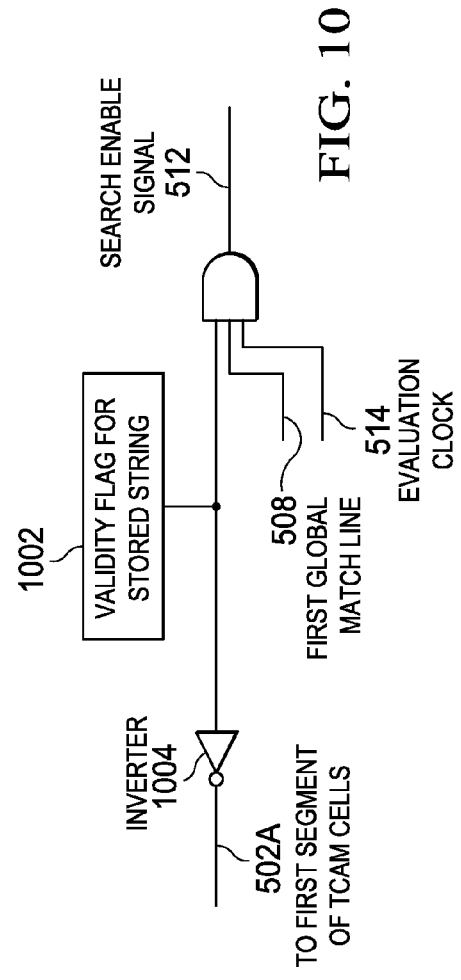
FIG. 2
FIG. 10

| SBI TX | SBI TY | X CELL | Y CELL |  |
|---|---|---|---|---|
| 0 | 0 | NA | NA | ALWAYS MATCH |
| 1 | 0 | 0 | 1 | MATCH |
| 1 | 0 | 1 | 0 | MISS |
| 0 | 1 | 1 | 0 | MATCH |
| 0 | 1 | 0 | 1 | MISS |
| 1 | 1 | NA | NA | INVALID |
| NA | NA | 0 | 0 | ALWAYS MATCH |
| NA | NA | 1 | 1 | INVALID |

SEGMENTED TERNARY CONTENT ADDRESSABLE MEMORY SEARCH ARCHITECTURE

FIELD OF TECHNOLOGY

Embodiments of the present invention relate to the field of electronics. More particularly, embodiments of the present invention relate to content addressable memory (CAM).

BACKGROUND

A content addressable memory (CAM) compares a search word (e.g., in multiple bits) against stored data, and returns the address of matching word in the stored data. The address of the matching word may be returned when every single bit of the search word finds its match in the stored data. A ternary CAM allows a third matching state of "X" or "Don't Care" for one or more bits in the stored word, thus adding flexibility to the search. For example, a ternary CAM might have a stored word of "10XX0" which would match any of the four search words "10000", "10010", "10100", or "10110".

FIG. 1A illustrates a TCAM 100 with a hierarchical match line structure. In FIG. 1A, the TCAM 100 comprises multiple columns of TCAM cells 102. The TCAM 100 comprises local match lines (LMLs) 104, a global match line (GML) 106, and local to global match line converters 108. As illustrated in FIG. 1A, the hierarchical match line architecture comprises match lines in two layers, where a local match line is connected to the global match line for every two columns of TCAM cells (e.g., 16 TCAM cells) as depicted in a TCAM sector 150.

FIG. 1B is an exploded view of the TCAM sector 150. In FIG. 1B, a local to global match line converter 152 comprises 5 transistors (e.g., P1, P2, P3, P4, and N1). Gates of transistors P1 and P2 at node 1 154 as well as the gate of transistor N1 at node 2 156 are precharged. In the case of a "miss" during a search operation, where corresponding search bits of a search string are compared with stored bits in 8 TCAM cells 158 and 8 TCAM cells 160, a LML 162 or a LML 164 goes to "low," thus pulling the GML 106 to "high." However, in the case of "match," both the LML 162 and the LML 164 go "high," thus pulling down the GML 106 to "low." Accordingly, the "miss" case may consume more power for the TCAM 100 than the "match case." Additionally, as the TCAM 100 has a "high" probability of the "miss" case than the "match" case, the TCAM 100 may consume large power in every search cycle as the GML 106 is maintained in the "high" state for the most of time.

SUMMARY

A segmented ternary content addressable memory (TCAM) search architecture is disclosed. In one aspect, a TCAM device with a row of TCAM cells includes a first segment of the TCAM cells for determining a match of corresponding search bits of a search string with a first portion of a stored string in the first segment of the TCAM cells, an evaluation module for generating a search enable signal if the match of the corresponding search bits with the first portion of the stored string is determined, and a second segment of the TCAM cells for determining a match of remaining search bits of the search string with a remaining portion of the stored string in response to the search enable signal.

In another aspect, a TCAM system with a row of TCAM cells includes a first segment of the TCAM cells for determining a match of corresponding search bits of a search string with a first portion of a stored string in the first segment of the TCAM cells using a hierarchical match line structure, an evaluation module for generating a search enable signal if the match of the corresponding search bits with the first portion of the stored string is determined, and a second segment of the TCAM cells for determining a match of remaining search bits of the search string with a remaining portion of the stored string in response to the search enable signal.

In yet another aspect, a TCAM device includes two rows of TCAM cells. Each row of the TCAM cells includes a first segment of the TCAM cells for determining a match of corresponding search bits of a search string with a first portion of a stored string in the first segment of the TCAM cells, an evaluation module for generating a search enable signal if the match of the corresponding search bits with the first portion of the stored string is determined, a second segment of the TCAM cells for determining a match of a second portion of search bits of the search string with a second portion of the stored string in response to the search enable signal.

The devices and/or systems disclosed herein may be implemented by any means for achieving various aspects, and may be executed in a form of a machine readable medium embodying a set of instructions that, when executed by a machine, cause the machine to perform any of the operations disclosed herein.

BRIEF DESCRIPTION OF THE DRAWINGS

Embodiments of the present invention are illustrated by way of examples and not limited to the figures of the accompanying drawings, in which like references indicate similar elements and in which:

FIG. 2 illustrates an operation of an exemplary segmented TCAM device, according to one embodiment;

FIG. 10 illustrates an exemplary block diagram for processing validity information of the stored string in the segmented TCAM device of FIG. 3, according to one embodiment.

Figure 1A:
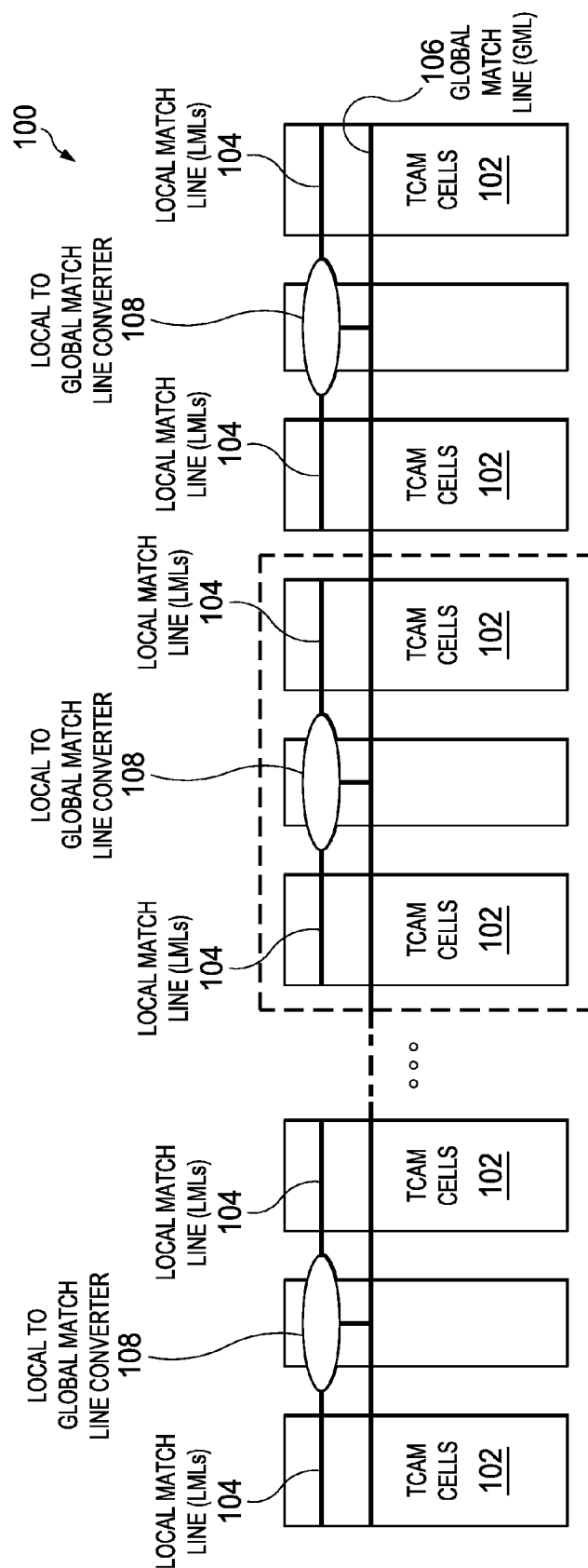
FIG. 1A illustrates a TCAM 100 with a hierarchical match line architecture.
Figure 1B:
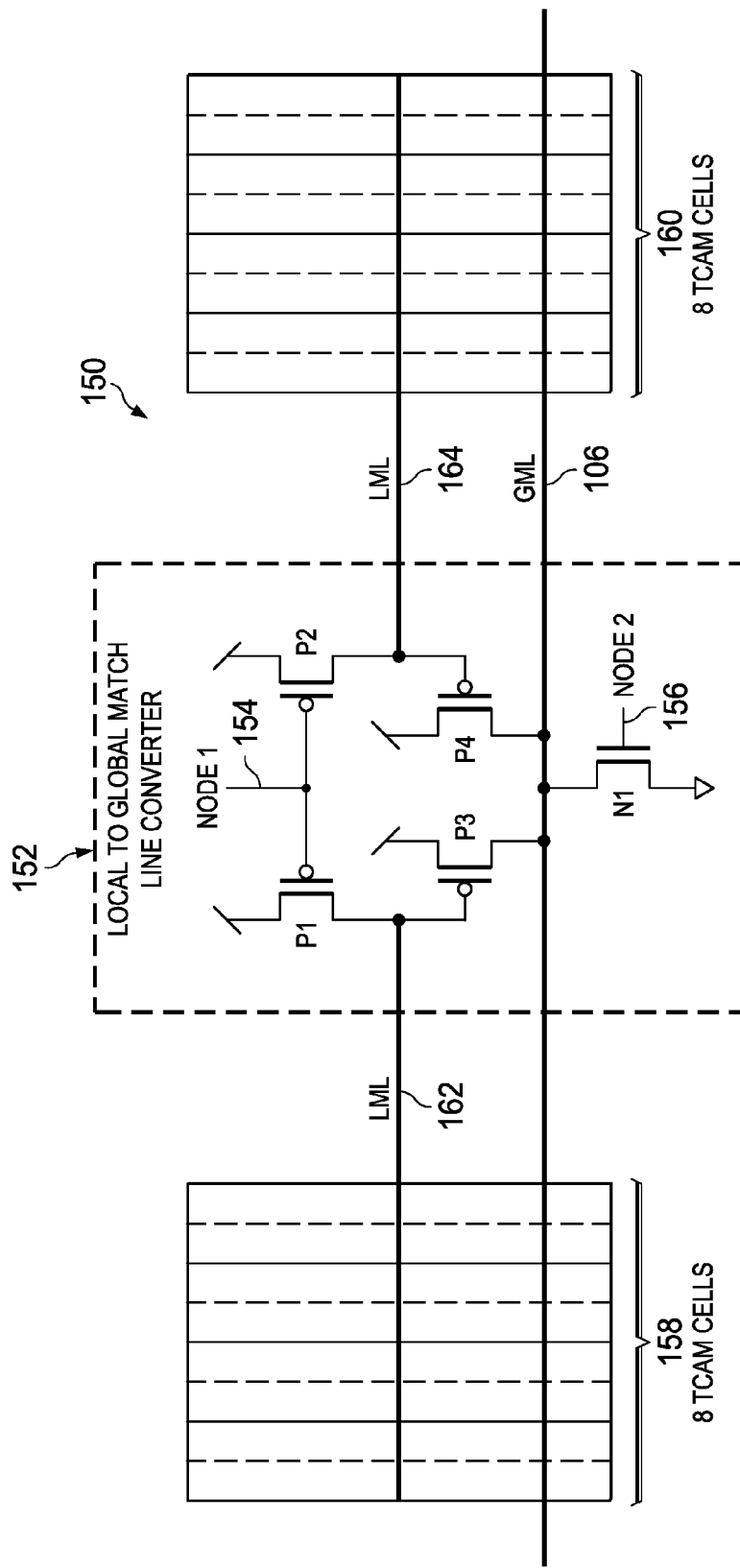
FIG. 1B is an exploded view of the TCAM sector 150.

Other features of the present embodiments will be apparent from the accompanying drawings and from the detailed description that follows.

DETAILED DESCRIPTION

A segmented ternary content addressable memory (TCAM) search architecture is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

FIG. 2 illustrates an operation of an exemplary segmented TCAM device 200, according to one embodiment. As shown in FIG. 2, the segmented TCAM device 200 includes a first segment of TCAM cells 202, an evaluation module 204 and a second segment of TCAM cells 206.

In operation, the first segment of TCAM cells 202 determines a match of corresponding search bits of a search string 208 with a first portion of a stored string 210 in the first segment of the TCAM cells 202. For example, the first portion of the stored string 210 may include 16 bits or 64 bits. In one example embodiment, the first segment of TCAM cells 202 generates a match signal 212 based on the determination. Further, the evaluation module 204 generates a search enable signal 214 if the match of the corresponding search bits with the first portion of the stored string 210 is determined. Furthermore, the second segment of TCAM cells 206 determines a match of remaining search bits of the search string 216 with a remaining portion of the stored string 218 in response to the search enable signal 214. For example, the size of the remaining portion of the stored string 218 (e.g., 64 bits, 256 bits, etc.) may be larger than the size of the first portion of the stored string 210.

Figure 3:
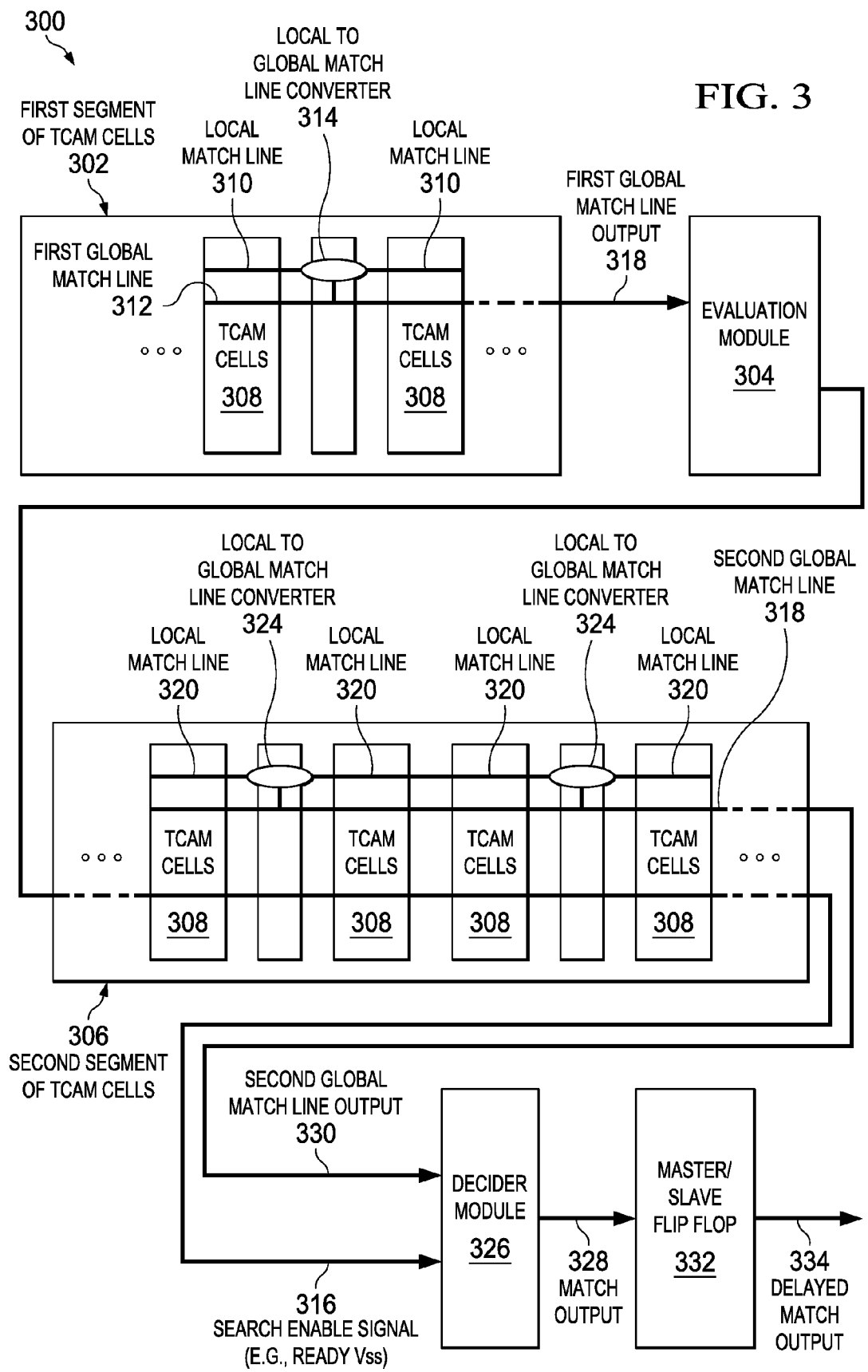
FIG. 3 is an exemplary segmented TCAM device with a hierarchical match line structure, according to one embodiment.

FIG. 3 is an exemplary segmented TCAM device 300 with a hierarchical match line structure, according to one embodiment. As shown in FIG. 3, the segmented TCAM device 300 includes a first segment of TCAM cells 302, an evaluation module 304 and a second segment of TCAM cells 306. It is appreciated that the first segment of TCAM cells 302, the evaluation module 304 and the second segment of TCAM cells 306 are exemplary embodiments of the first segment of TCAM cells 202, the evaluation module 204 and the second segment of TCAM cells 206 of FIG. 2, respectively. Further, as shown in FIG. 3, the first segment of TCAM cells 302 and the second segment of TCAM cells 306 include multiple TCAM cells 308 with a hierarchical match line structure.

Furthermore, the hierarchical match line structure of the first segment of TCAM cells 302 includes multiple local match lines 310, where each local match line 310 determines a match of each individual search bit of corresponding search bits with its respective bit of a first portion of a stored string. The hierarchical match line structure also includes a first global match line 312 for determining a match of the corresponding search bits with the first portion of the stored string and for generating a first global match line output 318.

In addition, the hierarchical match line structure of the first segment of TCAM cells 302 includes a local to global match line converter 314 for translating outputs of the multiple local match lines 310 to the first global match line 312. In one embodiment, the evaluation module 304 generates a search enable signal 316 if the match of the corresponding search bits with the first portion of the stored string is determined.

Furthermore, as shown in FIG. 3, the hierarchical match line structure of the second segment of TCAM cells 306 includes multiple local match lines 320, with each local match line 320 determining a match of each individual search bit of a remaining search bits with its respective bit of a second portion of the stored string. The hierarchical match line structure of the second segment of TCAM cells 306 also includes a second global match line 322 for generating a second global match line output 330. In addition, the hierarchical match line structure of the second segment of TCAM cells 306 includes a local to global match line converter 324 for translating outputs of the multiple local match lines 320 to the second global match line 322.

Moreover, the segmented TCAM device 300 includes a decider module 326 for determining a match output 328 of the search string with the stored string based on the search enable signal 316 and the second global match line 322. The segmented TCAM device 300 also includes a master/slave flip flop 332 for latching the match output 328 of the search string until next search cycle and providing a delayed match output 334.

Figures 4A, 4B:
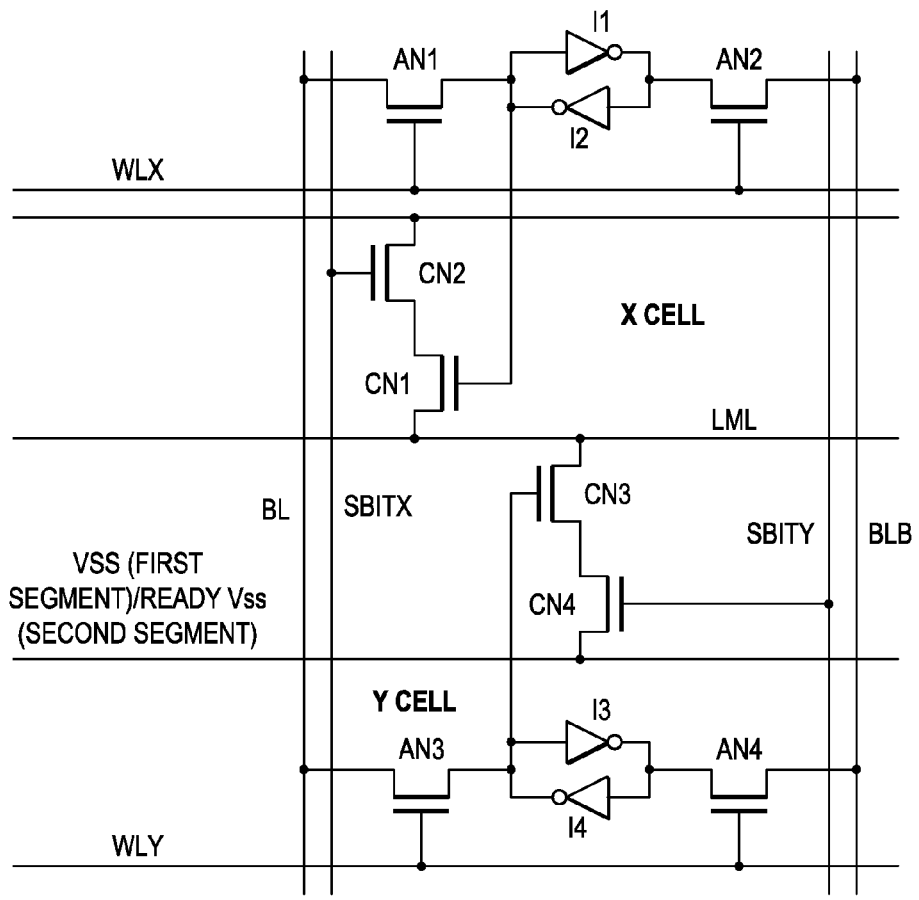
FIG. 4 is a block diagram of a stacked TCAM cells.

FIG. 4 is a block diagram of a stacked TCAM cell 400. Particularly, FIG. 4A illustrates a vertically stacked TCAM cell 400, in which X cell and Y cell are placed vertically. Further, FIG. 4B shows a table which includes exemplary match outputs (e.g., always match, match, miss and invalid) obtained based on a match of individual bit of the search string with its respective bits of a stored string. The U.S. Pat. No. 7,259,979 describes FIG. 4 and is hereby incorporated by reference in its entirety.

Figure 5:
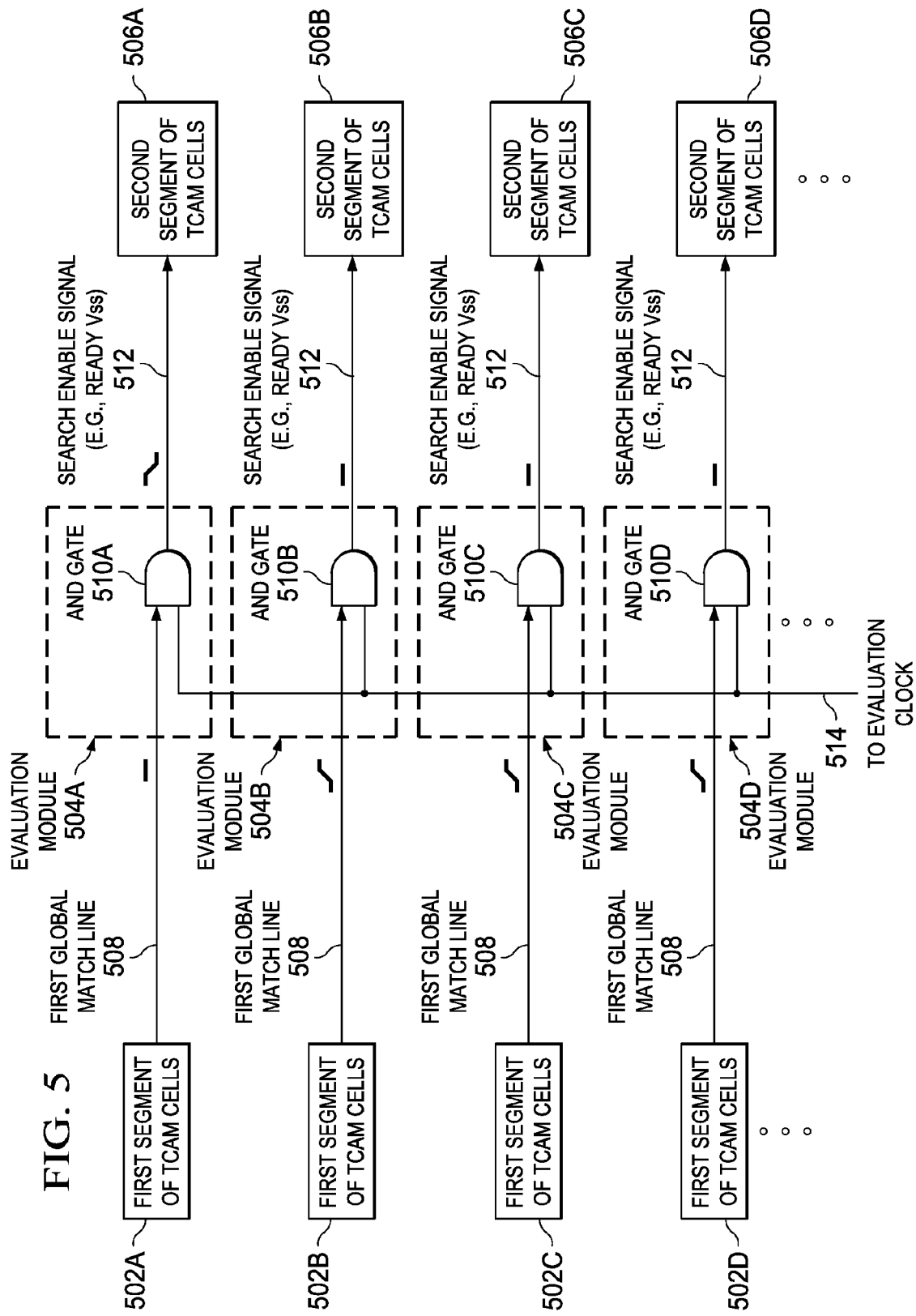
FIG. 5 is an exemplary segmented TCAM device with multiple rows of TCAM cells, according to one embodiment.

FIG. 5 is an exemplary segmented TCAM device 500 with multiple rows of TCAM cells, according to one embodiment. It is appreciated that the segmented TCAM device 500 is an exemplary embodiment of the segmented TCAM device 300 of FIG. 3. Particularly, FIG. 5 illustrates the segmented TCAM device 500 with multiple TCAM cells stacked vertically. As shown in FIG. 5, the segmented TCAM device 500 includes first segments of TCAM cells 502A through 502D, evaluation modules 504A through 504D and second segments of TCAM cells 506A through 506D.

It can be seen from FIG. 5 that, the first segments of the TCAM cells 502A through 502D are coupled to the evaluation modules 504A through 504D via first global match lines 508. Further, the evaluation modules 504A through 504D are coupled to the second segments of the TCAM cells 506A through 506D via search enable signals 512. Furthermore, as shown in FIG. 5, the evaluation modules 504A through 504D includes AND gates 510A through 510D for generating a search enable signals 512 (e.g., ready Vss) based on first global match lines 508. Also, as shown in FIG. 5, a second input of the AND gates 510A through 510D is coupled to an evaluation clock 514.

In one embodiment, the first segment of TCAM cells 502A determines a match of corresponding search bits of a search string with a first portion of a stored string in the first segment of the TCAM cells 502A and the first global match line 508 remains pre-discharged. As a result, the search enable signal 512 (e.g., in the first row of the TCAM cells) goes to "low" (i.e., goes to Vo) such that the second segment of the TCAM cells 506A determines a match of remaining search bits of the search string with a remaining portion of the stored string, as illustrated in FIG. 5.

In an alternate embodiment, if the match of the corresponding search bits of the search string with the first portion of the stored string is not determined, then the first global match lines 508 are precharged. As a result, the search enable signals 512 (e.g., in second, third and fourth rows of TCAM cells) remain precharged such that the match of remaining search bits of the search string with the remaining portion of the stored string is not determined by the second segments of TCAM cells 506A through 506D, as illustrated in FIG. 5.

Figure 6:
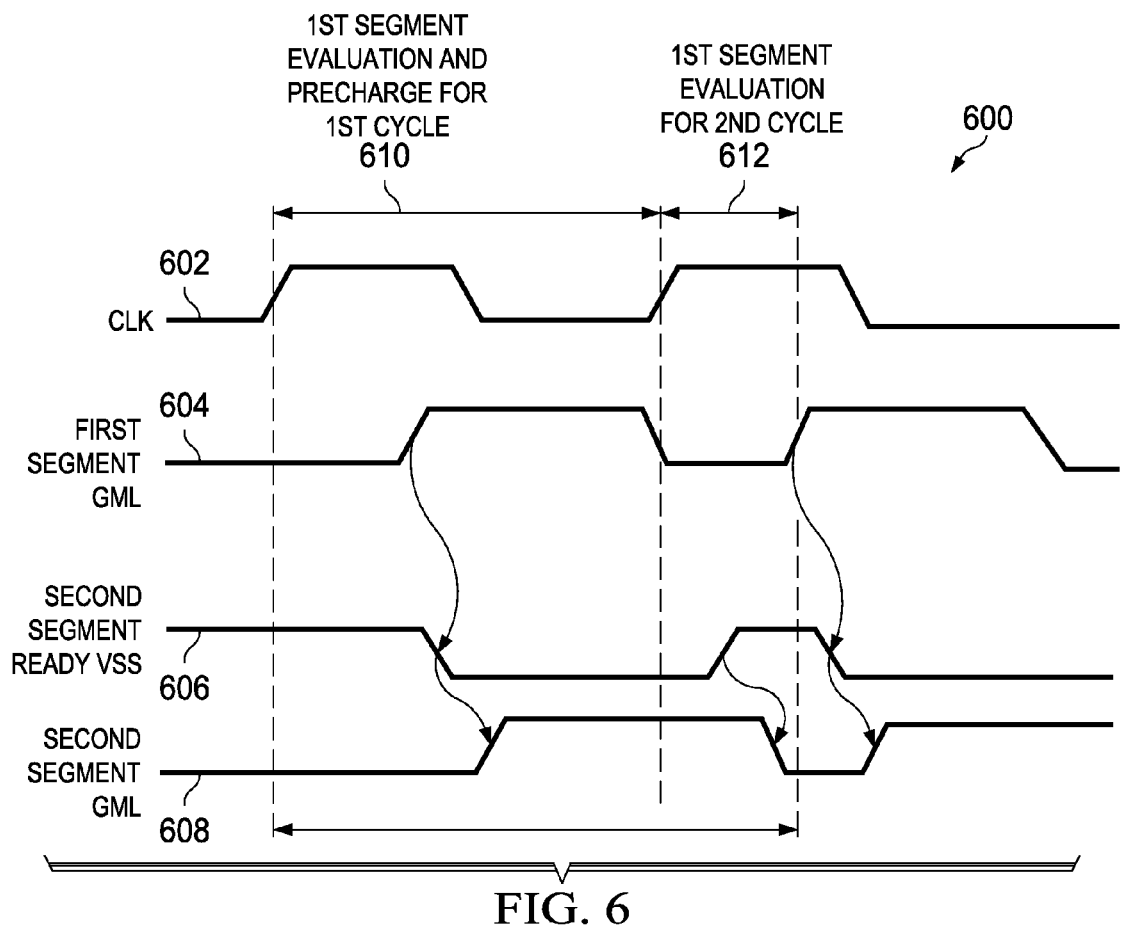
FIG. 6 illustrates an exemplary power cycle of the segmented TCAM device in FIG. 2, 3, or 5, according to one embodiment.

FIG. 6 illustrates an exemplary power cycle 600 of the segmented TCAM device in FIG. 2, 3, or 5, according to one embodiment. Particularly, FIG. 6 illustrates the power cycle 600 for two search cycles, viz. a first cycle 610 and a second cycle 612. The timing diagram 602 illustrates a clock cycle, generated during the start of a search operation. The timing diagram 604 illustrates a first segment global match line (GML), generated during the clock cycle. The timing diagram 606 depicts a second segment ready Vss going "low" upon the first segment GML going "high". The timing diagram 608 depicts a second segment GML going "high" upon the second segment ready Vss going "low".

Further, the sequence of the search cycle in the segmented TCAM device is as follows:

First segment search takes place during the first cycle 610

Second segment ready Vss enable signal is generated during the first cycle 610

Second segment evaluation and first segment precharge take place during the first cycle 610 and the second cycle 612

First segment evaluation for the next search operation and a second segment precharge take place during the second cycle 612.

From the above and from FIG. 6, it can be noted that, the first segment evaluation and precharge takes place during the first cycle 610 and the first segment evaluation for the next search operation takes place during the second cycle 612. Also, it can be seen from FIG. 6 that, the second segment evaluation and precharge is completed during the first cycle 610 and some part of the second cycle 612. Further, it is appreciated that the second segment evaluation and precharge can be completed before the first segment evaluation for the second cycle 612 takes place. This helps reduce cycle time for the search operation.

Figure 7:
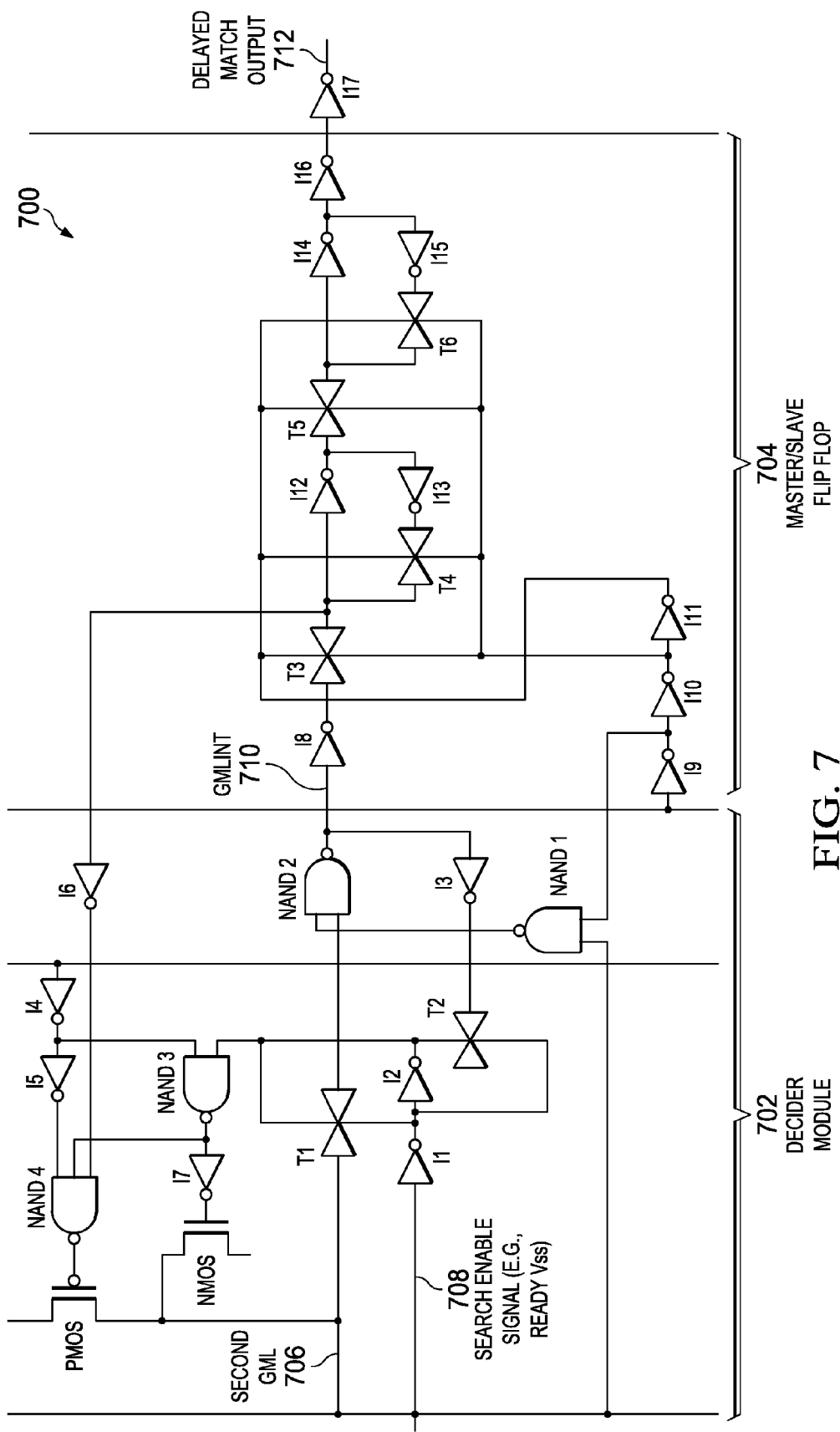
FIG. 7 is an exemplary circuit diagram of a decider module and a master/slave flip flop, according to one embodiment.

FIG. 7 is an exemplary circuit diagram 700 of a decider module 702 and a master/slave flip flop 704, according to one embodiment. It is appreciated that the decider module 702 and the master/slave flip flop 704 are exemplary embodiments of the decider module 326 and the master/slave flip flop 332 of FIG. 3 respectively. As shown in FIG. 7, inputs to the decider module 702 are a second global match line 706 and a search enable signal 708 (e.g., ready Vss). Further, an output from the decider module 702 is GMLINT 710, which forms an input to the master/slave flip flop 704. Furthermore, the master/slave flip flop 704 outputs a delayed match output 712. As mentioned above, the decider module 702 determines a match output of a search string with a stored string based on the second global match line 706 and the search enable signal 708 (e.g., ready Vss) and the master/slave flip flop 704 then latches the match output of the search string until next search cycle.

When the operation commences, the output of the decider module 702 is held on previous match data and is not connected to the second global match line 706 (i.e., the transmission gate T1 is turned off). When a clock is launched, the output of the decider module 702 is made "miss," and before this, the previous match output is transferred from the master flop of the master/slave flip flop 704 to the slave flop, where the master flop is off and the slave flop is on. It is appreciated that the above operation is completed before completion of a new search operation. Further, in the case of "match", the search enable signal 708 goes "low" and the second global match line 706 is connected to the GMLINT 710 (i.e., the transmission gate T1 is turned on). In the case of "miss", the search enable signal 708 remains "high" and the second global match line 706 is not connected to the GMLINT 710 (i.e., the transmission gate T1 remains off).

Accordingly, the decider module 702 provides the match output to the master/slave flip flop 704 via the GMLINT 710. Furthermore, at start of the operation, the master latch is in "off" state and the slave latch is in "on" state, whereas at end of the operation, the master latch is in "on" state and the slave latch is in "off" state. Accordingly, the master/slave flip flop 704 transfers a match output (i.e., the delayed match output 712) of the previous search at start of the operation and latches a match output of the current search on the master latch at the end of the operation. It is appreciated that, the match output is provided to the user with one cycle latency due to pipelining, which helps reduce match access time (i.e., with one cycle start delay). This is described in greater details with respect to FIG. 8.

Figure 8:
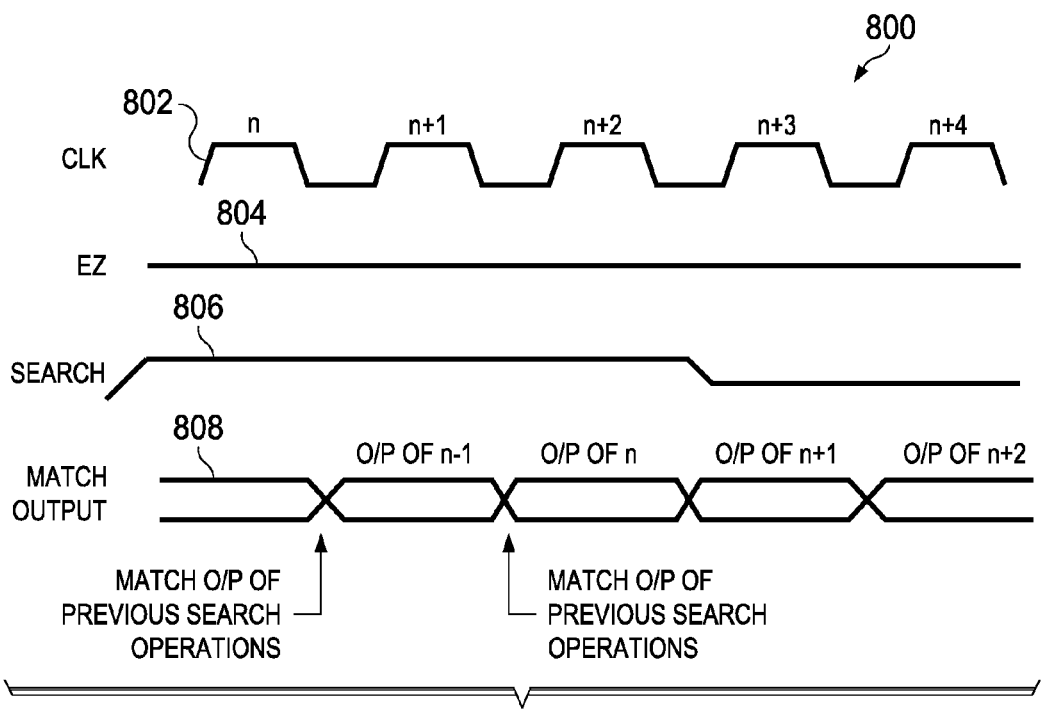
FIG. 8 illustrates an exemplary signal diagram for search signal and match output of the segmented TCAM device of FIG. 3, according to one embodiment.

FIG. 8 illustrates an exemplary signal diagram 800 for search signal and match output of the segmented TCAM device 300 of FIG. 3, according to one embodiment. In one embodiment, the signal diagram 800 illustrates a pipeline match access time waveform. The CLK 802 illustrates a clock cycle generated at the start of the search operation. The EZ 804 illustrates a memory select (TCAM enable) signal generated during the clock cycle. The search 806 illustrates a search signal. The match output 808 illustrates a match output based on the search signal. It can be seen from FIG. 8 that, the match output 808 is delivered to the user with the latency of one cycle due to pipelining. Further, it is appreciated that, the match output with one cycle latency reduces the match access time.

Figure 9:
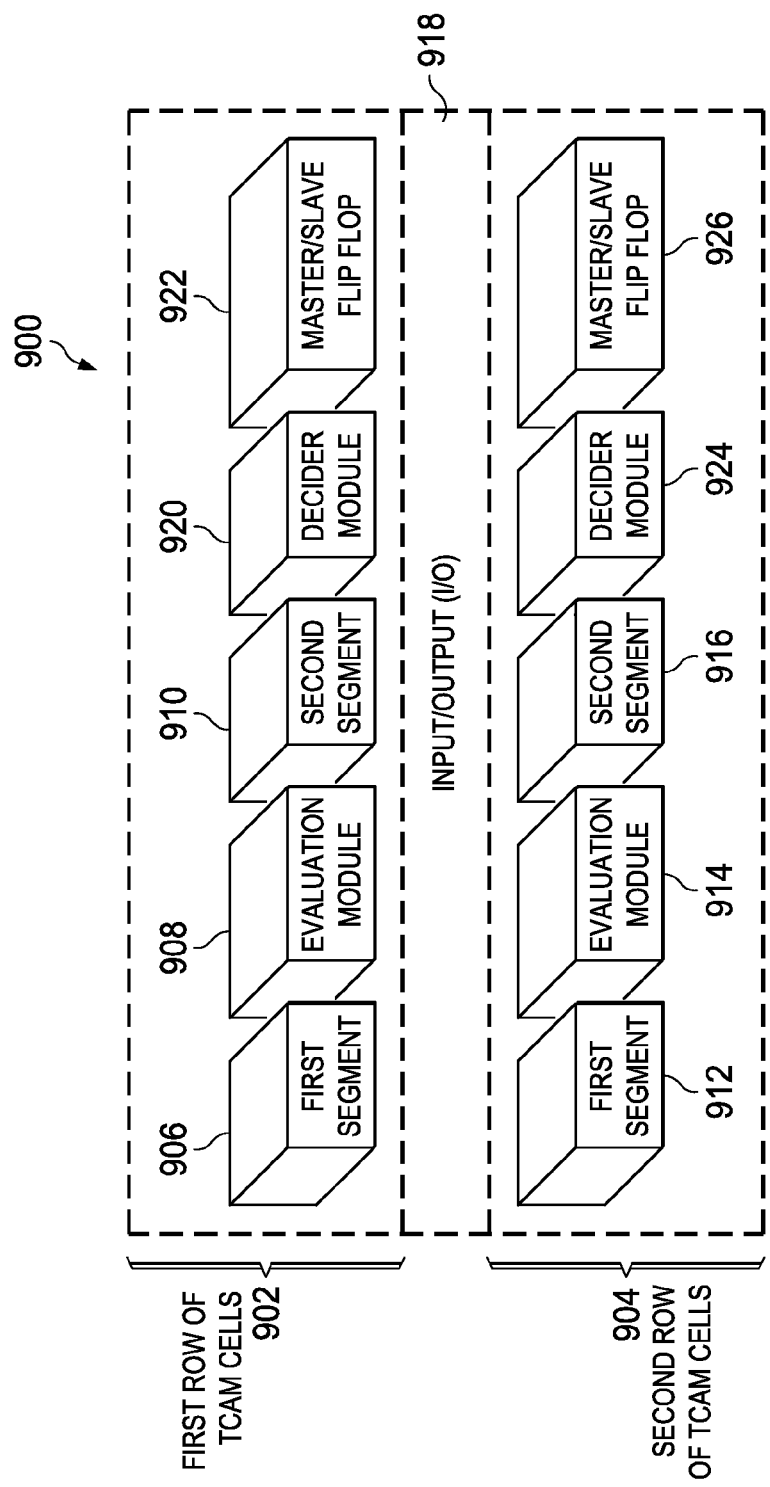
FIG. 9 illustrates an exemplary segmented TCAM device in a vertical butterfly architecture, according to one embodiment.

FIG. 9 illustrates an exemplary segmented TCAM device 900 in a vertical butterfly architecture, according to one embodiment. As shown in FIG. 9, the segmented TCAM device 900 includes a first row of TCAM cells 902 and a second row of TCAM cells 904. The segmented TCAM device 900 also includes an input/output (I/O) 918 (e.g., logic clock data which trigger the search operation) for the TCAM cells, which is formed between the first row 902 and the second row 904. Further, as shown in FIG. 9, the first row of TCAM cells 902 includes a first segment 906, an evaluation module 908, a second segment 910, a decider module 920 and a master/slave flip flop 922.

Furthermore, as shown FIG. 9, the second row of TCAM cells 904 includes a first segment 912, an evaluation module 914, a second segment 916, a decider module 924 and a master/slave flip flop 926. Moreover, it is appreciated that the first row of TCAM cells 902 and the second row of TCAM cells 904 are exemplary embodiments of the segmented TCAM device 300 of FIG. 3. Therefore, the explanation of the above-described elements is hereof omitted.

Further, it can be seen from FIG. 9 that, the segmented TCAM device 900 is having a vertical butterfly architecture, which helps reduce X dimension of the segmented TCAM device 900. It is appreciated that, by reducing the X dimension of the segmented TCAM device 900, it is possible to reduce the match line capacitance. Also, the segmented TCAM device 900 facilitates reduction in RC delay (e.g., by four times), which helps improve the performance of the segmented TCAM device 900.

FIG. 10 illustrates an exemplary block diagram 1000 for processing validity information of the stored string in the segmented TCAM device 300 of FIG. 3, according to one embodiment. As shown in FIG. 10, an inverter 1004 is coupled between the validity flag for stored string 1002 and the first segment of TCAM cells 502A. In one example embodiment, the validity flag for the stored string 1002 includes validity information for each stored string. Further, it is appreciated that the TCAM device 300 evaluates valid search strings based on the validity information. In other words, if the validity flag for the stored string 1002 is set to "0", then the inverter 1004 coupled to the validity flag for stored string 1002 stops determining of the match of the corresponding search bits of the search string with the first portion of the stored string in the first segment of TCAM cells 502A.

Alternatively, if the validity flag for stored string 1002 is set to "1", then the inverter 1004 coupled to the validity flag for stored string 1002 allows the determining of the match of the corresponding search bits of the search string with the first portion of the stored string in the first segment of TCAM cells 502A. Thus, processing of the validity information for stored string facilitates reduction in power consumption in the TCAM device. For example, if 5% of the 1024 search strings are invalid, no power is consumed by these strings.

The above-described segmented TCAM device reduces power consumption by dividing TCAM full word into two segments such that the second segment search is controlled and rendered more efficient by the first segment search. Further, the above-described segmented TCAM device ensures reduction in match line power consumption by breaking search activity into two parts. The above-described segmented TCAM architecture ensures no search for invalid words through valid bit gating which helps save power in the segmented TCAM device. Also, the above-described segmented TCAM device ensures reduction in search line power consumption by providing non-pulsed search line for the second segment of TCAM cells.

It is appreciated that the second segment search line power is directly proportional to input data toggling. For example, the NMOS (n-channel metal oxide semiconductor) stack of the second segment of TCAM cells is connected to ready Vss which is precharged on completion of a search cycle such that search line can remain in their previous state even if match line precharge starts. In this manner, the above-described segmented TCAM device also facilitates reduction in ready Vss power as the ready Vss has been precharged only up to Vdd-Vt.

Furthermore, the above-described segmented TCAM device reduces match excess time by providing the match output with one cycle latency. In addition, the above-described segmented TCAM device ensures reduction in cycle time by timing the two segments in such a way that the two segments work in a pipeline fashion. Moreover, the above-described segmented TCAM device ensures reduction in match line capacitance (e.g., by 60%). In one embodiment, the above-described segmented TCAM device can operate at 400 MHz.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuit (ASIC)).

What is claimed is:

1. A TCAM device with a row of TCAM cells, comprising:
   a first segment of the TCAM cells for determining a match of corresponding search bits of a search string with a first portion of a stored string in the first segment of the TCAM cells;
   an evaluation module for generating a search enable signal if the match of the corresponding search bits with the first portion of the stored string is determined; and
   a second segment of the TCAM cells for determining a match of remaining search bits of the search string with a remaining portion of the stored string in response to the search enable signal.

2. The device of claim 1, wherein the first segment comprises a hierarchical match line structure which includes:
   a plurality of local match lines with each local match line for determining a match of each individual search bit of the corresponding search bits with its respective bit of the first portion of the stored string;
   a first global match line for determining a match of the corresponding search bits with the first portion of the stored string; and
   at least one local to global match line converter for translating outputs of the plurality of local match lines to the first global match line.

3. The device of claim 1, wherein the second segment comprises a hierarchical match line structure which includes:
   a plurality of local match lines with each local match line for determining a match of each individual search bit of the remaining search bits with its respective bit of the second portion of the stored string;
   a second global match line for determining a match of the remaining search bits with the second portion of the stored string; and
   a local to global match line converter for translating outputs of the plurality of local match lines to the second global match line.

4. The device of claim 2, wherein the evaluation module comprises an AND gate for generating the search enable signal based on the first global match line.

5. The device of claim 3, further comprising a decider module for determining a match output of the search string with the stored string based on the search enable signal and the second global match line.

6. The device of claim 5, further comprising a master/slave flip flop for latching the match output of the search string until next search cycle.

7. The device of claim 1, wherein each TCAM cell comprises a stacked TCAM cell.

8. The device of claim 1, wherein the search enable signal comprises Vss.

9. The device of claim 1, further comprising an inverter coupled to a validity flag for the stored string for stopping the determining the match of the corresponding search bits of the search string with the first portion of the stored string in the first segment of the TCAM cells if the validity flag is set to "0".

10. A TCAM system with a row of TCAM cells, comprising:
    a first segment of the TCAM cells for determining a match of corresponding search bits of a search string with a first portion of a stored string in the first segment of the TCAM cells using a hierarchical match line structure, wherein the hierarchical match line structure includes:
       a plurality of local match lines with each local match line for determining a match of each individual search bit of the corresponding search bits with its respective bit of the first portion of the stored string;
       a global match line for determining a match of the corresponding search bits with the first portion of the string; and a local to global match line converter for translating outputs of the plurality of local match lines to the global match line;

an evaluation module for generating a search enable signal if the match of the corresponding search bits with the first portion of the stored string is determined; and a second segment of the TCAM cells for determining a match of remaining search bits of the search string with a remaining portion of the stored string in response to the search enable signal.

11. The system of claim 10, wherein the second segment comprises a hierarchical match line structure which includes:

a plurality of local match lines with each local match line for determining a match of each individual search bit of the remaining search bits with its respective bit of the second portion of the stored string;

a second global match line for determining a match of the remaining search bits with the second portion of the stored string; and a local to global match line converter for translating outputs of the plurality of local match lines to the second global match line.

12. A TCAM device with two rows of TCAM cells, each row of the TCAM cells comprising:

a first segment of the TCAM cells for determining a match of corresponding search bits of a search string with a first portion of a stored string in the first segment of the TCAM cells;

an evaluation module for generating a search enable signal if the match of the corresponding search bits with the first portion of the stored string is determined;

a second segment of the TCAM cells for determining a match of a second portion of search bits of the search string with a second portion of the stored string in response to the search enable signal, wherein, the first portion and the second portion of the search bits comprise half of the search bits; and wherein the first portion and the second portion of the store string comprise half of the stored string.

13. The device of claim 12, further comprising at least one input/output (I/O) to the TCAM cells formed between the two rows of TCAM cells.

14. The device of claim 12, wherein the first segment comprises a hierarchical match line structure which includes:

a plurality of local match lines with each local match line for determining a match of each individual search bit of the corresponding search bits with its respective bit of the first portion of the stored string;

a first global match line for determining a match of the corresponding search bits with the first portion of the stored string; and at least one local to global match line converter for translating outputs of the plurality of local match lines to the first global match line.

15. The device of claim 12, wherein the second segment comprises a hierarchical match line structure which includes:

a plurality of local match lines with each local match line for determining a match of each individual search bit of the remaining search bits with its respective bit of the second portion of the stored string;

a second global match line for determining a match of the remaining search bits with the second portion of the stored string; and a local to global match line converter for translating outputs of the plurality of local match lines to the second global match line.

16. The device of claim 14, wherein the evaluation module comprises an AND gate for generating the search enable signal based on the first global match line.

17. The device of claim 15, further comprising a decider module for determining a match output of the search string with the stored string based on the search enable signal and the second global match line.

18. The device of claim 17, further comprising a master/slave flip flop for latching the match output of the search string until next search cycle.

19. The device of claim 12, wherein each TCAM cell comprises a stacked TCAM cell.

20. The device of claim 12, wherein the search enable signal comprises Vss.

* * * * *